United States Patent
Lee et al.

(10) Patent No.: US 11,802,918 B2
(45) Date of Patent: Oct. 31, 2023

(54) THERMAL RUNAWAY DETECTING DEVICE, BATTERY SYSTEM, AND THERMAL RUNAWAY DETECTING METHOD OF BATTERY SYSTEM

(71) Applicant: SAMSUNG SDI CO., LTD., Yongin-si (KR)

(72) Inventors: Daesung Lee, Yongin-si (KR); Hyunah Park, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 145 days.

(21) Appl. No.: 17/129,138

(22) Filed: Dec. 21, 2020

(65) Prior Publication Data
US 2021/0190881 A1 Jun. 24, 2021

(30) Foreign Application Priority Data
Dec. 23, 2019 (KR) .................. 10-2019-0173307

(51) Int. Cl.
*G01R 31/396* (2019.01)
*G01R 31/3842* (2019.01)
*G01K 3/00* (2006.01)

(52) U.S. Cl.
CPC ........... *G01R 31/396* (2019.01); *G01K 3/005* (2013.01); *G01R 31/3842* (2019.01)

(58) Field of Classification Search
CPC .............. G01R 31/396; G01R 31/3842; G01R 31/374; G01R 31/3835; G01R 31/392;
(Continued)

(56) References Cited

U.S. PATENT DOCUMENTS

2009/0155674 A1   6/2009   Ikeuchi et al.
2011/0210703 A1*  9/2011   Souza ................. H01M 10/486
                                                                320/136
(Continued)

FOREIGN PATENT DOCUMENTS

DE   102011075361 A1 * 11/2012 .......... H01M 10/486
JP       3697724 B2      9/2005
(Continued)

OTHER PUBLICATIONS

THZ3 & TDZ3 Dual Input Smart HART Temperature Transmitter, Moore Industries, 20017 (Year: 2017).*
(Continued)

*Primary Examiner* — Daniel R Miller
(74) *Attorney, Agent, or Firm* — Lee IP Law, P.C.

(57) ABSTRACT

A thermal runaway detecting device for a battery system including a plurality of cells, including: a first measuring module for measuring temperature values of the plurality of cells via at least one temperature sensor; a second measuring module for measuring an output voltage value of the battery system; and a controller for determining validity of a temperature-based detection of thermal runaway by monitoring data received from the first measuring module, and detecting a thermal runaway of the battery system by selectively monitoring the temperature values or the output voltage value according to a result of the determining of validity of the temperature-based detection of thermal runaway.

17 Claims, 5 Drawing Sheets

(58) Field of Classification Search
CPC .............. G01R 31/382; G01R 31/3648; G01R 31/367; G01R 31/385; G01R 31/389; G01K 3/005; Y02E 60/10; H01M 10/425; H01M 10/633; H01M 10/486; H01M 10/482; H01M 10/48; H01M 2010/4271; H01M 2010/4278; G01N 25/20; H02J 7/00309; H02J 7/0047; H02J 7/0029; H02H 7/18
See application file for complete search history.

(56) References Cited

U.S. PATENT DOCUMENTS

| | | | |
|---|---|---|---|
| 2016/0111758 A1 | 4/2016 | Stimm | |
| 2016/0372801 A1* | 12/2016 | Clemente | H01M 50/20 |
| 2019/0051952 A1 | 2/2019 | Yano | |
| 2019/0379092 A1 | 12/2019 | Schiffer et al. | |
| 2020/0185784 A1* | 6/2020 | Yeom | H01M 10/44 |

FOREIGN PATENT DOCUMENTS

| | | | |
|---|---|---|---|
| JP | 2014-089858 A | | 5/2014 |
| JP | 2016018638 A | * | 2/2016 |
| JP | 2016025024 A | * | 2/2016 |
| JP | 2018-206524 A | | 12/2018 |
| KR | 10-2009-0066202 A | | 6/2009 |
| KR | 10-2012-0069334 A | | 6/2012 |
| KR | 10-2014-0064176 A | | 5/2014 |
| KR | 10-2014-0116599 A | | 10/2014 |
| KR | 10-2019-0139133 A | | 12/2019 |

OTHER PUBLICATIONS

ISL78600 Multi-Cell Li-Ion Battery Manager, 2018 (Year: 2018).*
Korean Office action dated Mar. 24, 2021.
European Search Report dated May 21, 2021.
Korean Notice of Allowance dated Sep. 23, 2021.

* cited by examiner

THERMAL RUNAWAY DETECTING DEVICE, BATTERY SYSTEM, AND THERMAL RUNAWAY DETECTING METHOD OF BATTERY SYSTEM

CROSS-REFERENCE TO RELATED APPLICATION

Korean Patent Application No. 10-2019-0173307, filed on Dec. 23, 2019, in the Korean Intellectual Property Office, and entitled: "Thermal Runaway Detecting Device, Battery System, and Thermal Runaway Detecting Method of Battery System," is incorporated by reference herein in its entirety.

BACKGROUND

1. Field

Embodiments relate to a thermal runaway detecting device, a battery system, and a thermal runaway detecting method of the battery system.

2. Description of the Related Art

A rechargeable battery may be repeatedly charged and discharged. A rechargeable battery with low capacity may be used as a power supply device for small electronic devices such as mobile phones, laptop computers, and camcorders, and a rechargeable battery with high capacity may be used as a power supply device for hybrid vehicles.

A rechargeable battery may include an electrode assembly including a positive electrode, a negative electrode, and a separator provided between the positive electrode and the negative electrode, a case for receiving the electrode assembly, and an electrode terminal electrically connected to the electrode assembly. An electrolyte solution is injected into a case so as to allow the battery to be charged and discharged by the positive electrode, the negative electrode, and an electrochemical reaction of an electrolyte solution. A shape of the case, such as a cylinder or a rectangle, is changeable depending on the use of the battery.

The above information disclosed in this Background section is only for enhancement of understanding of the background of the art, and therefore it may contain information that does not form the prior art that is already known in this country to a person of ordinary skill in the art.

SUMMARY

Embodiments are directed to a thermal runaway detecting device for a battery system including a plurality of cells, including: a first measuring module for measuring temperature values of the plurality of cells via at least one temperature sensor; a second measuring module for measuring an output voltage value of the battery system; and a controller for determining validity of a temperature-based detection of thermal runaway by monitoring data received from the first measuring module, and detecting a thermal runaway of the battery system by selectively monitoring the temperature values or the output voltage value according to a result of the determining of validity of the temperature-based detection of thermal runaway.

The controller may determine the validity of the temperature-based detection of thermal runaway according to a communication state between the first measuring module and the controller, determine whether a problem is generated in the first measuring module and the at least one temperature sensor, and determine validity of data received from the first measuring module.

When the communication state between the first measuring module and the controller is a disability state, the controller may monitor the output voltage value to detect the thermal runaway of the battery system.

When a problem is generated in the first measuring module or the at least one temperature sensor, the controller may monitor the output voltage value to detect the thermal runaway of the battery system.

The first measuring module may further perform a diagnosis function for diagnosing whether a problem is generated with performance of the first measuring module and the at least one temperature sensor, and transmit a result data of the diagnosis function to the controller.

The first measuring module may measure voltage values of the plurality of cells and a battery module configured with the plurality of cells, and compare a voltage value acquired by measuring a voltage between respective ends of the battery module with respective voltage values acquired by measuring voltages of the plurality of cells to diagnose whether a problem is generated in the first measuring module.

The first measuring module may diagnose whether a problem is generated in the at least one temperature sensor by monitoring at least one of the temperature values acquired from the at least one temperature sensor.

The first measuring module may diagnose whether a communication problem with the controller is generated by monitoring data transmitted to or received from the controller.

When the data received from the first measuring module is determined to be invalid by the controller, the controller may monitor the output voltage value to detect the thermal runaway of the battery system.

When the temperature-based detection of thermal runaway is determined to be valid, the controller may monitor the temperature values to detect the thermal runaway of the battery system.

The first measuring module and the second measuring module may communicate with the controller through separate communication lines.

Embodiments are also directed to a battery system, including: a plurality of battery cells; and a thermal runaway detecting device according to an embodiment.

Embodiments are also directed to a thermal runaway detecting method of a battery system including a plurality of cells, including: determining validity of temperature-based detection of thermal runaway by monitoring data received from a first measuring module for measuring temperature values of the plurality of cells through at least one temperature sensor; and detecting a thermal runaway of the battery system by selectively monitoring the temperature values measured by the first measuring module or an output voltage value of the battery system measured by a second measuring module according to a result of the determining of validity of the temperature-based detection of thermal runaway.

The detecting may include, when the temperature-based detection of thermal runaway is determined to be invalid, detecting the thermal runaway of the battery system by monitoring the output voltage value.

The determining may include, when a communication state between the first measuring module and a controller is a disability state, determining detection of the thermal runaway of the battery system based on the output voltage value.

The determining may include: diagnosing the first measuring module and the at least one temperature sensor; and when a problem is generated in the first measuring module or the at least one temperature sensor, determining that the temperature-based detection of thermal runaway is invalid.

The diagnosing may include diagnosing whether a problem is generated in the first measuring module by comparing a voltage value acquired by measuring a voltage at respective ends of a battery module having the cells with voltage values acquired by measuring respective voltages of the cells.

The diagnosing may include diagnosing whether a problem is generated in the at least one temperature sensor by monitoring at least one of the temperature values acquired from the at least one temperature sensor.

The determining may include: determining validity of data received from the first measuring module, and when the data received from the first measuring module is determined to be invalid, determining that the temperature-based detection of thermal runaway is invalid.

The detecting may include, when the temperature-based detection of thermal runaway is determined to be valid, detecting the thermal runaway of the battery system by monitoring the temperature values.

BRIEF DESCRIPTION OF THE DRAWINGS

Features will become apparent to those of skill in the art by describing in detail example embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

In the present specification, the term "and/or" includes all or various combinations of a plurality of items that are related and arranged. When the embodiments are described, the use of "may" signifies "at least one embodiment". Regarding the description of an embodiment, a singular term may include a plural form unless stated in another way.

Terms including ordinal numbers such as first, second, and the like will be used only to describe various components, and are not to be interpreted as limiting these components. The terms are only used to differentiate one component from other components. In an example embodiment, a first constituent element could be termed a second constituent element, and similarly, a second constituent element could be termed a first constituent element, without departing from the scope of the disclosure.

A thermal runaway detecting device, a battery system, and a thermal runaway detecting method of a battery system according to example embodiments will now be described in detail with reference to accompanying drawings.

Figure 1:
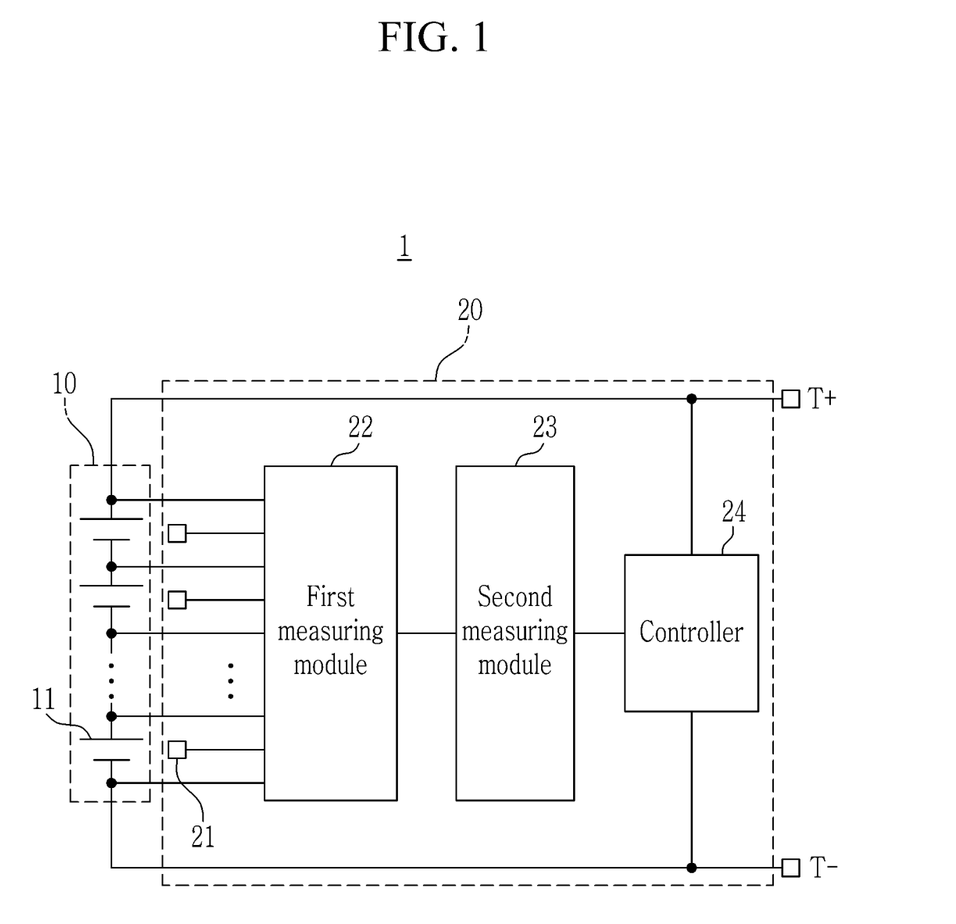
FIG. 1 shows a battery system according to an example embodiment.

FIG. 1 shows a battery system 1 according to an example embodiment.

Referring to FIG. 1, the battery system 1 may include a battery module 10 and a thermal runaway detecting device 20.

The battery module 10 may include at least one rechargeable battery cell (referred to hereinafter as a cell) 11. Multiple cells 11 may be connected in series and/or in parallel with each other. The battery module 10 may be connected to an external charging device (not shown) or a load (not shown) through system terminals (T+ and T−), and may be charged by the charging device or discharged by the load. FIG. 1 exemplifies the battery system 1 including one battery module 10, but the battery system 1 may be configured with a plurality of battery modules 10 connected in series and/or in parallel to each other.

The thermal runaway detecting device 20 detects a thermal runaway of the battery system 1. The thermal runaway detecting device may include at least one temperature sensor 21, a first measuring module 22, a second measuring module 23, and a controller 24.

According to the present example embodiment, the temperature sensor 21 is disposed to contact or be around or near to at least one cell 11, and it may measure temperatures of a plurality of cells 11 configuring the battery module 10.

The first measuring module 22 may obtain a voltage value, a current value, and a temperature value of the battery module 10 by periodically measuring a voltage, a current, and a temperature of the battery module 10. In an example embodiment, the first measuring module 22 may be electrically connected to at least one temperature sensor 21 to detect the temperature values of the cells 11 configuring the battery module 10 through the at least one temperature sensor 21. In an example embodiment, the first measuring module 22 may be electrically connected to respective ends of the battery module 10 to detect the voltage value of the battery module 10. Further, the first measuring module 22 may be electrically connected to respective ends of the cells 11 configuring the battery module 10 to detect cell voltage values of the cells 11.

The first measuring module 22 may have a self-diagnosis function, and may diagnose performance errors, e.g., whether a problem is generated, with respect to the first measuring module 22 and/or a sensor (e.g., a temperature sensor 21) connected to the first measuring module 22 according to the diagnosis function. In an example embodiment, the first measuring module 22 may compare the voltage value acquired by measuring a voltage at respective ends of the battery module 10 with voltage values acquired by measuring cell voltages of a plurality of cells 11 to confirm validity of the voltage values, and thereby diagnose whether a problem is generated with a voltage measuring function of the first measuring module 22. Further, the first measuring module 22 may compare the temperature values acquired from the temperature sensors 21 with each other to confirm validity of the temperature value, and thereby diagnose the temperature measuring function of the first measuring module 22 or whether a problem is generated in the temperature sensor 21, e.g., by evaluating whether a temperature-based detection of thermal runaway is valid or not valid (invalid). In an example embodiment, the first measuring module 22 may monitor data transmitted to/received from the controller 24 to diagnose whether a problem is generated with a communication function with the controller 24.

The first measuring module 22 may be implemented as, e.g., an analog front end (AFE) module or a cell supervision circuit (CSC).

The second measuring module 23 may continuously measure an output current and an output voltage of the battery system 1 to detect an output current value and an output voltage value of the battery system 1.

The second measuring module 23 may, as shown in FIG. 1, measure a voltage at the respective ends, e.g., system terminals (T+ and T−), of the battery module 10 to acquire an output voltage value of the battery system 1 when the battery system 1 includes one battery module 10. When the battery system 1 is configured to include a plurality of battery modules 10 connected in series and/or in parallel to each other, the second measuring module 23 may be electrically connected between a plurality of battery modules 10 and system terminals (T+ and T−) (i.e., between a positive terminal of the highest battery module and a negative terminal of the lowest battery module from among a plurality of battery modules) to measure an output voltage of the battery system 1.

Further, the second measuring module 23 may acquire an output current value of the battery system 1 by measuring a current flow between the battery module 10 and the system terminals (T+ and T−). In an example embodiment, the second measuring module 23 may be electrically connected to respective ends of a shunt resistor (not shown) connected between the battery module 10 and the system terminals (T+ and T−) to detect an output current value of the battery system 1 by measuring a voltage at the respective ends of the shunt resistor.

The second measuring module 23 may be implemented as a battery disconnected unit (BDU) or a system basis chip (SBC).

The controller 24 may communicate with the first measuring module 22 to receive a voltage value, a current value, and a temperature value acquired from the battery module 10 from the first measuring module 22. The controller 24 may communicate with the second measuring module 23 to receive an output voltage value and an output current value of the battery system 1. Here, a communication line for the controller 24 to communicate with the first measuring module 22 may be separated from a communication line for the controller 24 to communicate with the second measuring module 23. Hence, even if the communication line between the first measuring module 22 and the controller 24 is damaged by the thermal runaway, the controller 24 may normally communicate with the second measuring module 23.

The controller 24 may detect generation of the thermal runaway in the battery system 1 based on a measured value (e.g., a temperature value) received from the first measuring module 22 and a measured value (e.g., an output voltage value of the battery system 1) received from the second measuring module 23. For example, the controller 24 may monitor the data received from the first measuring module 22 to diagnose a communication state between the first measuring module 22 and the controller 24, whether a problem is generated in the first measuring module 22 and the temperature sensor 21, or validity of the data received from the first measuring module 22, and may determine whether the detection of thermal runaway based on the measured value received from the first measuring module 22 is valid or not based on the diagnosis result. The controller 24 may detect generation of thermal runaway of the battery system 1 by selectively using the measured value received from the first measuring module 22 or the measured value received from the second measuring module 23 based on the validity determination result.

In an example embodiment, when the detection of thermal runaway based on the measured value received from the first measuring module 22 is determined to be valid, the controller 24 may detect generation of thermal runaway by monitoring the temperature values received from the first measuring module 22. The controller 24 may determine that a thermal runaway phenomenon is generated when a steep temperature change is detected on at least one cell 11, e.g., when variance per time unit on the temperature values measured by the at least one temperature sensor 21 exceeds a threshold value.

On the other hand, when the detection of thermal runaway based on the measured value received from the first measuring module 22 is determined to be not valid, the controller 24 may detect generation of thermal runaway by monitoring an output voltage value of the battery system 1 received from the second measuring module 23. In this case, the first measuring module 22 may continuously measure the output voltage value of the battery system 1 and may transmit it to the controller 24 when an electrical connection between the battery module 10 and an external device is blocked by a power switch (not shown) connected between the battery module 10 and the external device, e.g., when an output current of the battery system 1 does not flow. The controller 24 may monitor the output voltage value of the battery system 1 received from the second measuring module 23, and when the variance per time unit of the output voltage of the battery system 1 exceeds the threshold value, the controller 24 may determine that a thermal runaway phenomenon is generated.

When a thermal runaway is generated in at least one cell 11 in the battery system 1, the temperature of the cell 11 may be abruptly changed by the thermal runaway, the voltage at the damaged cell 11 may drop, and the output voltage of the battery system 1 may also abruptly drop. Therefore, the battery system 1 according to the present example embodiment may provide redundancy in the detection of thermal runaway by detecting a thermal runaway based on the temperature values received from the first measuring module 22 when a thermal runaway may be detected based on the temperature value acquired through the first measuring module 22, or by detecting a thermal runaway by receiving the output voltage value of the battery system 1 from the second measuring module 23 if not.

The controller 24 may be a battery management unit (BMU), a battery system manager (BSM), or a battery management system (BMS).

The configuration of the battery system 1 shown in FIG. 1 may be varied, e.g., the battery system 1 may be configured to include a greater or lesser number of constituent elements than the constituent elements described with reference to FIG. 1. In an example embodiment, the battery system 1 may further include at least one power switch (not shown) connected between the battery module 10 and at least one of the system terminals (T+ and T−) and blocking/allowing an electrical connection between the battery module 10 and an external load/charging device.

Figure 2:
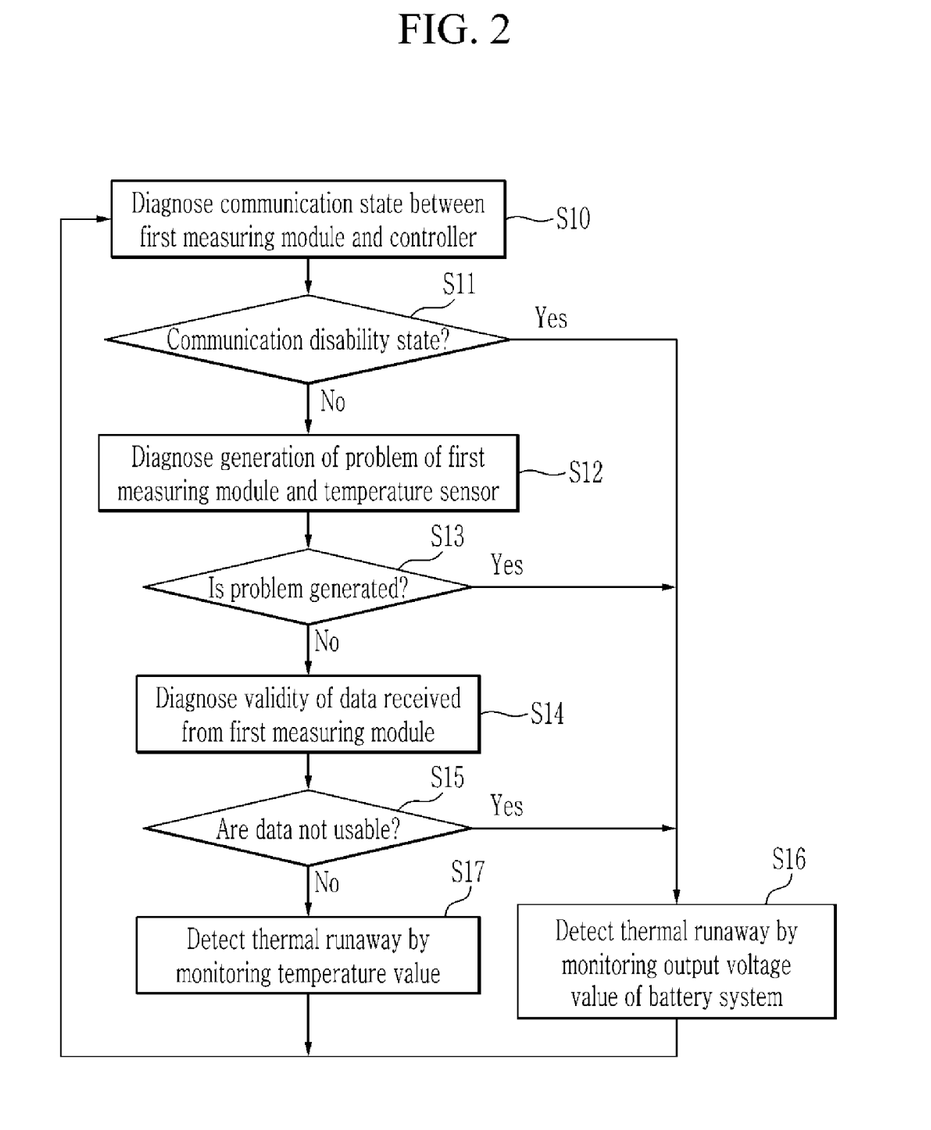
FIG. 2 shows a thermal runaway detecting method of a battery system according to an example embodiment.

FIG. 2 shows a thermal runaway detecting method of a battery system 1 according to an example embodiment. The thermal runaway detecting method described with reference to FIG. 2 may be performed by the thermal runaway detecting device 20 of the battery system 1 described with reference to FIG. 1.

Referring to FIG. 2, the controller 24 of the thermal runaway detecting device 20 according to an example embodiment may diagnose a communication state between the first measuring module 22 and the controller 24 (S10). When the communication state is determined to be a communication disability state (S11) as a diagnosis result, the controller 24 may monitor the output voltage value of the battery system 1, as measured not by the first measuring module 22 but instead by the second measuring module 23, and may detect the thermal runaway of the battery system 1 (S16).

Figure 3:
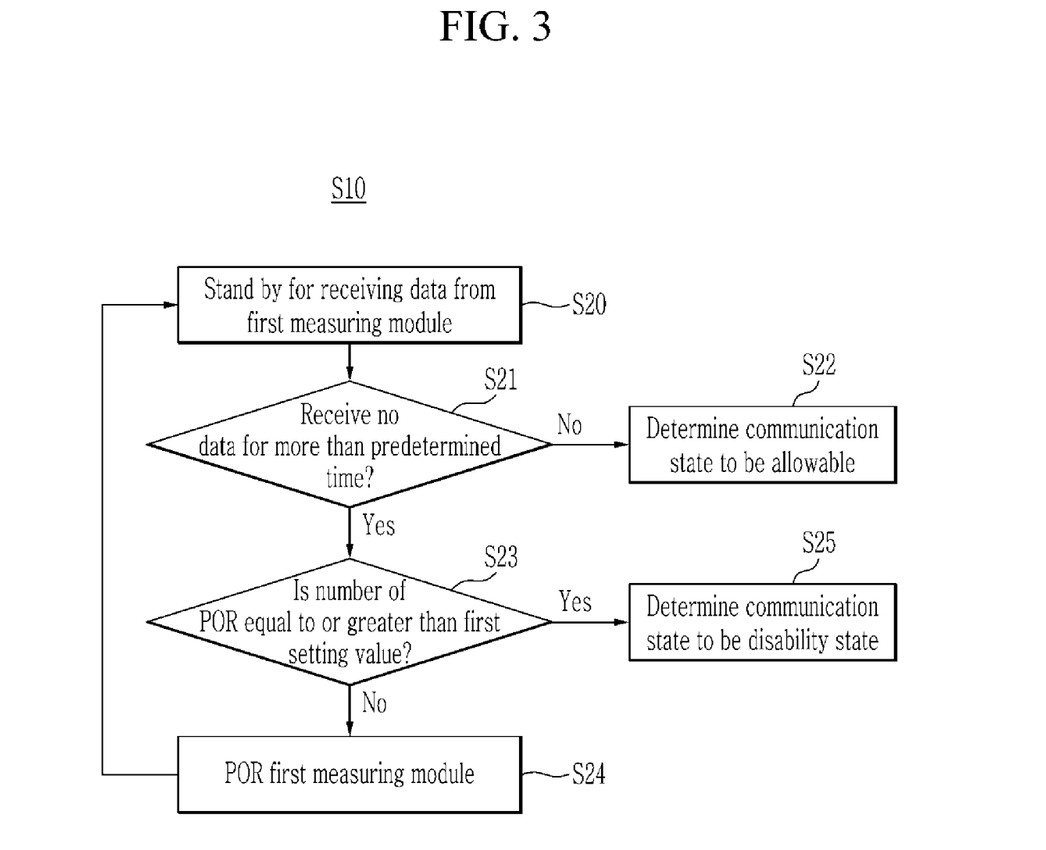
FIG. 3 shows a diagnosis method in S10 of FIG. 2.

FIG. 3 shows a diagnosis method in S10 of FIG. 2.

Referring to FIG. 3, the controller 24 of the thermal runaway detecting device 20 according to an example embodiment may stand by for receiving data from the first measuring module 22 (S20), and when receiving no data from the first measuring module 22 for more than a predetermined time (S21), the controller 24 determine the communication state to be a communication disability state, and may reset the first measuring module 22, e.g., by performing a power-on reset (POR) on the first measuring module 22 (S24).

The first measuring module 22 periodically transmits the measured values acquired by the first measuring module 22 to the controller 24. Therefore, when receiving no data from the first measuring module 22 for more than a predetermined time, the controller 24 may determine that a communication function between the controller 24 and the first measuring module 22 is in a disability state.

When the communication function between the controller 24 and the first measuring module 22 enters the disability state because of a temporary error, it may be restored into a normal state through the power-on reset (POR) of the first measuring module 22.

Additionally, when no data is received from the first measuring module 22 and a number of power-on resets of the first measuring module 22 is equal to or greater than a first setting value (S23), the controller 24 may finally determine the communication state between the controller 24 and the first measuring module 22 to be a disability state (S25). In an example embodiment, when receiving no data from the first measuring module 22 for more than a predetermined time after power-on resetting the first measuring module 22 once, the controller 24 may determine the communication state between the controller 24 and the first measuring module 22 to be a disability state.

Additionally, when receiving data from the first measuring module 22 before or after power-on resetting the first measuring module 22, the controller 24 may determines the communication state between the controller 24 and the first measuring module 22 to be valid or allowable (S22).

The time for standing by for receiving data in S21 and/or the first setting value in S23 may be adjustable depending on requirements of the battery system 1 or time conditions.

Referring again to FIG. 2, the controller 24 may diagnose generation of problem in the first measuring module 22 and the temperature sensor 21 connected to the first measuring module 22 based on the diagnosis result of the first measuring module 22 (S12). When a problem is determined to be generated in the first measuring module 22 and/or the temperature sensor 21 (S13), the controller 24 may monitor the output voltage value of the battery system 1, as measured not by the first measuring module 22 but by the second measuring module 23, to detect the thermal runaway of the battery system 1 (S16).

Figure 4:
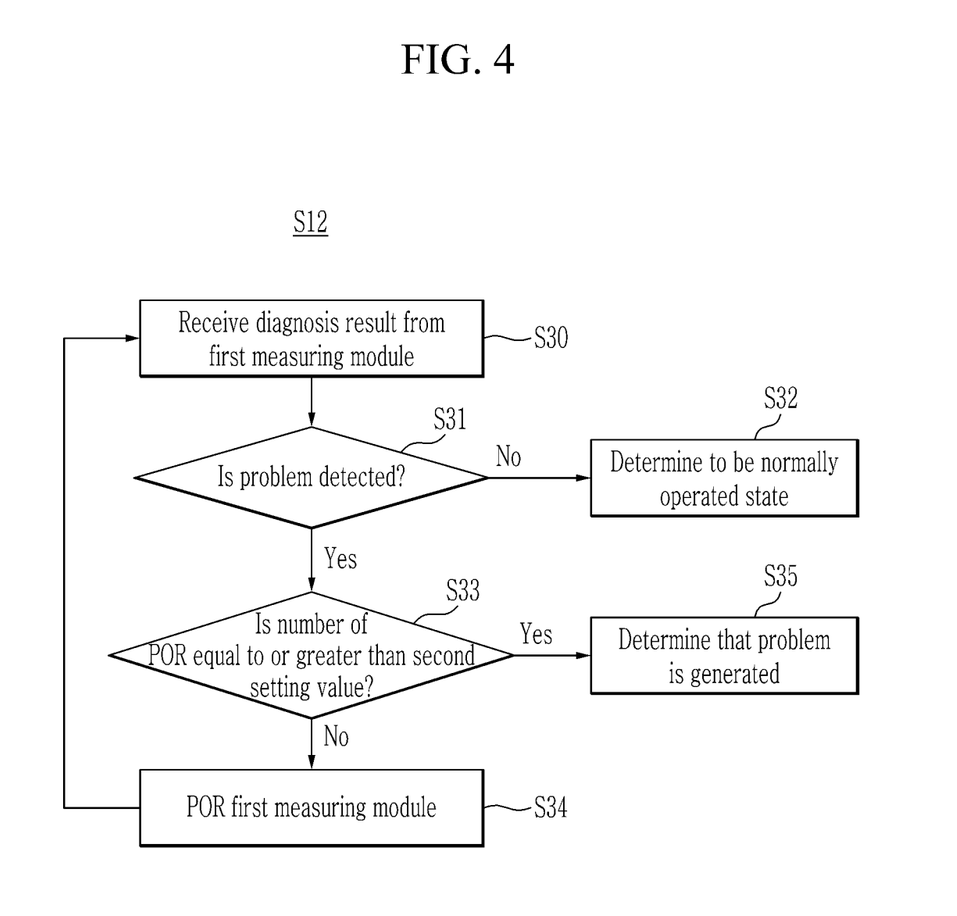
FIG. 4 shows a diagnosis method in S12 of FIG. 2.

FIG. 4 shows a diagnosis method in S12 of FIG. 2.

Referring to FIG. 4, the first measuring module 22 of the thermal runaway detecting device 20 according to an example embodiment may periodically perform a diagnosis function to determine whether a problem is generated with a plurality of performance items, and may transmit a diagnosis result to the controller 24. In an example embodiment, the first measuring module 22 may compare the voltage value acquired by measuring the voltage at the respective ends or terminals of the battery module 10 with voltage values acquired by measuring the cell voltages of a plurality of cells 11, and may confirm validity of the voltage values to diagnose whether a problem is generated with the voltage measuring performance of the first measuring module 22. Further, the first measuring module 22 may diagnose whether a problem is generated with the temperature measuring function of the first measuring module 22 or in the temperature sensor 21 by comparing the temperature values acquired from the temperature sensors 21 and confirming the validity of the temperature values. The first measuring module 22 may also monitor the data transmitted/received by the controller 24 to diagnose whether a problem is generated with the communication function with the controller 24.

When receiving the diagnosis result from the first measuring module 22 (S30), the controller 24 may confirm the diagnosis result to thus confirm whether a problem is detected in the first measuring module 22 and the temperature sensor 21 (S31). When no problem is detected, the controller 24 may determine that the first measuring module 22 and the temperature sensor 21 are normally operating (S32).

The first measuring module 22 may not transmit a diagnosis result to the controller 24 when no problem is detected according to the diagnosis function. In this case, the controller 24 may determine that the first measuring module 22 and the temperature sensor 21 are normally operating if a diagnosis result is not received from the first measuring module 22.

When detection of a problem is confirmed according to S31, the controller 24 may reset (i.e., power-on reset (POR)) the first measuring module 22 (S34).

When a performance error of the first measuring module 22 or the temperature sensor 21 is temporary or when a temporary diagnosis error is generated by the first measuring module 22, the diagnosis result of the first measuring module 22 may be restored to the normal state through the power-on reset (POR) of the first measuring module 22.

When a detection of problem according to the self-diagnosis of the first measuring module 22 is consecutively generated until the number of power-on resets of the first measuring module 22 is equal to or greater than a second setting value (e.g., three times) (S33), the controller 24 may finally determine that a problem is generated in the first measuring module 22 and/or the temperature sensor (S35).

The second setting value in the S33 may be adjustable according to the requirements of the battery system 1 or the time conditions.

Referring again to FIG. 2, the controller 24 may diagnose validity of the data received from the first measuring module (S14), and may confirm whether the data received from the first measuring module 22 are usable based on the diagnosis result (S15). When the data received from the first measuring module 22 are determined to be not usable, the controller 24 may monitor the output voltage value of the battery system 1, as measured not by the first measuring module 22 but by the second measuring module 23, to detect the thermal runaway of the battery system 1 (S16).

Figure 5:
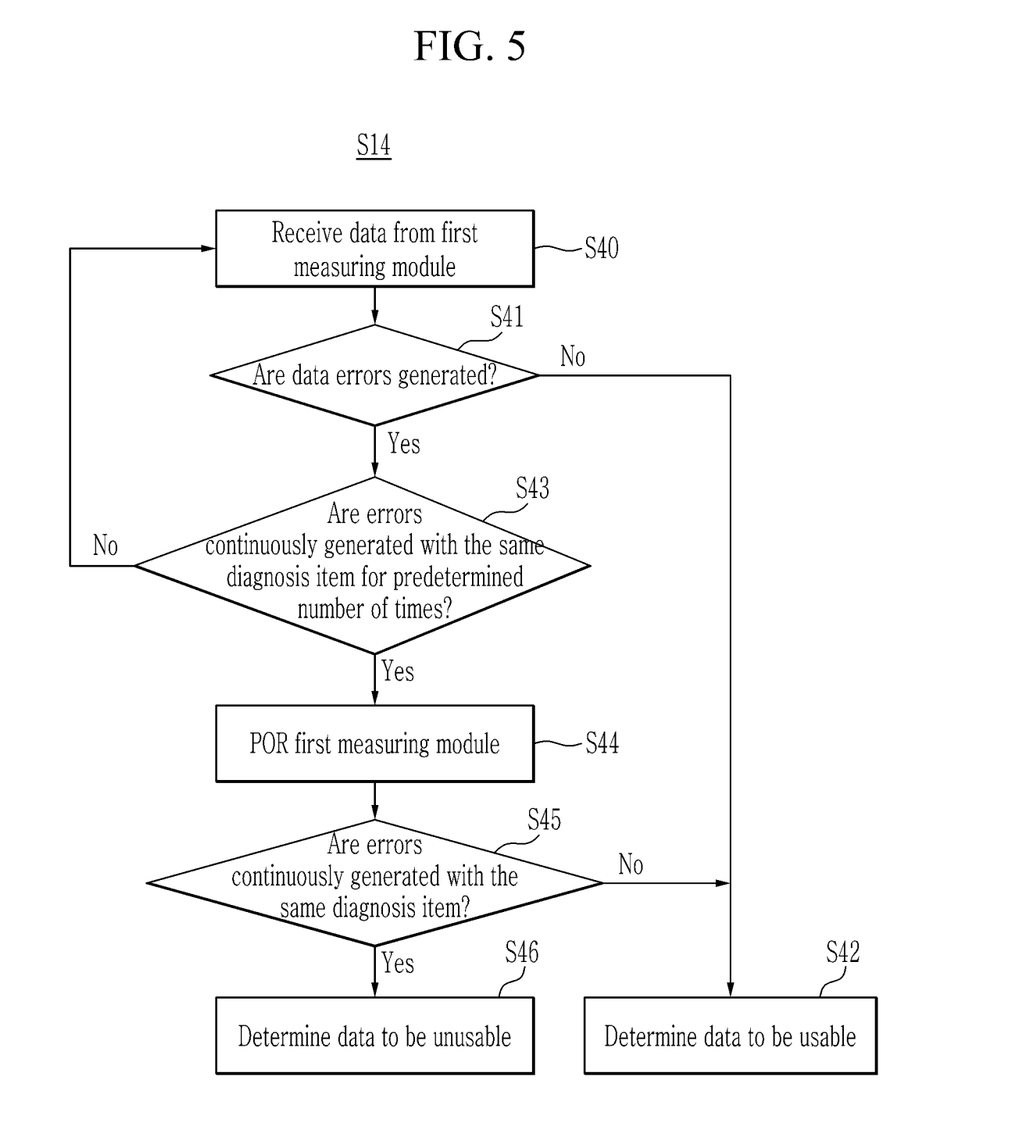
FIG. 5 shows a diagnosis method in S14 of FIG. 2.

FIG. 5 shows a diagnosis method in S14 of FIG. 2.

Referring to FIG. 5, the controller 24 of the thermal runaway detecting device 20 according to an example embodiment may receive data from the first measuring module 22 (S40), and may verify validity of the received data to confirm whether data errors are generated (S41). For example, when receiving data from the first measuring module 22, the controller 24 may confirm whether data are lost while being transmitted from the first measuring module 22 or whether wrong data are transmitted by the first measuring module 22 according to a verification of validity.

When no error is detected from the received data, the controller 24 may determine the data received from the first measuring module 22 to be usable (S42).

When errors are detected from the received data, the controller 24 may confirm whether errors are continuously generated with the same diagnosis item for a predetermined number of times (e.g., twice) (S43) so as to confirm whether the errors are temporary errors, and when the errors are continuously generated with the same item for a predetermined number of times, the controller 24 may power-on reset (POR) the first measuring module 22 (S44). The controller 24 may confirm whether errors are continuously generated with the same item after the power-on resetting (S45), and when the errors are continuously generated, the controller 24 may determines the errors to be not temporary, and may finally determine the data received from the first measuring module 22 to be invalid and unusable (S46).

Referring again to FIG. 2, when the cases are determined to be normal in S10, S12, and S14, e.g., when the communication state is determined to be normal through S10, the first measuring module 22 and the temperature sensor 21 are determined to be normally operated through S12, and validity of the data is verified through S14, the controller 24 may determine the detection of thermal runaway based on the measured values received from the first measuring module 22 to be valid. Therefore, the controller 24 may monitor the temperature values received from the first measuring module 22 to detect a thermal runaway of the battery system 1 (S17).

FIG. 2 shows a diagnosis process for determining whether detection of the thermal runaway based on the temperature value is valid, exemplifying a case including a process for diagnosing a communication state between the first measuring module 22 and the controller 24 (S10), a process for diagnosing whether a problem is generated in the first measuring module 22 and the temperature sensor 21 (S12), and a process for diagnosing validity of the data received from the first measuring module 22 (S14) in order. In another example embodiment, the process for diagnosing a communication state between the first measuring module 22 and the controller 24 (S10), the process for diagnosing whether a problem is generated in the first measuring module 22 and the temperature sensor 21 (S12), and the process for diagnosing validity on the data received from the first measuring module 22 (S14) may be implemented as separate tasks and may be performed according to independent schedules. In another example embodiment, one or more of the process for diagnosing a communication state between the first measuring module 22 and the controller 24 (S10), the process for diagnosing whether a problem is generated in the first measuring module 22 and the temperature sensor 21 (S12), and the process for diagnosing validity of the data received from the first measuring module 22 (S14) may be omitted.

According to an example embodiment, the battery system 1 may detect the thermal runaway of the battery system 1 in a condition in which it is not possible to detect the thermal runaway by measuring the temperature inside the battery system 1 (such as when a communication line between the BMS and the AFE module is damaged), when it is not possible to obtain a valid temperature value because of an error of the AFE module or the temperature sensor, or when the internal temperature of the battery system 1 digresses from the measurable range. Therefore, performance for detecting a thermal runaway of the battery system 1 may be improved, and safety of the battery system 1 may be increased.

By way of summation and review, a lithium ion battery, which is an example of a rechargeable battery, may generate a thermal runaway because of abnormal operation states such as internal short-circuit, overcharging, high temperature conditions, or external impacts. In the thermal runaway, a large amounts of heat may rapidly accumulate in the battery and thus generate a chain reaction, which may lead to the battery's ignition and explosion. Therefore, predicting or detecting the thermal runaway of the battery may improve safety of the battery.

In general, to sense the thermal runaway of the battery, a method for directly measuring an internal temperature of the battery, sensing a steep increase of the measured temperature, and predicting a thermal runaway may be used. However, this method for predicting a thermal runaway based on an internal temperature of the battery may not detect the thermal runaway when the internal temperature of the battery exceeds a range of measurement, or when a thermal runaway algorithm does not operate normally because of communication errors.

As described above, embodiments may provide a thermal runaway detecting device for detecting a thermal runaway phenomenon of a battery when it is difficult to predict the thermal runaway based on an internal temperature of the battery. Embodiments may also provide a battery system and a thermal runaway detecting method of the battery system.

Herein, electronic or electrical devices according to embodiments and/or other related devices or constituent elements may be implemented as using appropriate hardware, firmware (e.g., an application-specific integrated circuit), software, or combinations of software, firmware, and hardware. In an example embodiment, various configurations of the above-noted devices may be positioned on one integrated circuit (IC) chip or an individual IC chip. In addition, various configurations of the above-noted devices may be realized on a flexible printed circuit film, a tape carrier package (TCP), a printed circuit board (PCB), or one substrate. The electrical or mutual connections described herein may, for example, be implemented as the PCB, wires on different types of circuit carriers, or conductive elements. The conductive elements may, for example, include metallization such as surface metallizations and/or pins, and may include conductive polymers or ceramics. Further, electrical energy may be transmitted by electromagnetic radiation or a light-using radio access.

In addition, the various configurations of the devices may be performed by at least one processor so as to perform the above-described various functions, they may be performed in at least one computing device, and they may be processes or threads for performing computer program instructions and interacting with other system constituent elements. The computer program instruction may be stored in a memory realizable in a computing device using a standard memory device such as a random access memory (RAM). The computer program instruction may also be stored in a non-transitory computer readable medium such as a CD-ROM or a flash drive.

Further, various functions of the computing device may be combined or united to a single computing device, or functions of a specific computing device may be dispersed to at least another computing device while not digressing from the range of the embodiments.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

DESCRIPTION OF SYMBOLS

1: battery system
10: battery module
11: cell
20: thermal runaway detecting device
21: temperature sensor
22: first measuring module
23: second measuring module
24: controller

What is claimed is:

1. A thermal runaway detecting device for a battery system including a plurality of cells, the thermal runaway detecting device comprising:
a first measuring module for measuring temperature values of the plurality of cells via at least one temperature sensor;
a second measuring module for measuring an output voltage value of the battery system;
a controller for determining validity of a temperature-based detection of thermal runaway by monitoring data received from the first measuring module, and detecting a thermal runaway of the battery system by selectively monitoring the temperature values or the output voltage value according to a result of the determining of validity of the temperature-based detection of thermal runaway,
wherein, when the temperature-based detection of thermal runaway is determined to be invalid, the controller detects a thermal runaway of the battery system by monitoring a change in the output voltage value of the battery system, and
wherein the first measuring module further performs a diagnosis function for diagnosing whether a problem is generated with performance of the first measuring module and the at least one temperature sensor, the diagnosis function being performed by measuring voltage values of the plurality of cells and a battery module configured with the plurality of cells, and comparing a voltage value acquired by measuring a voltage between respective ends of the battery module with respective voltage values acquired by measuring voltages of the plurality of cells, and transmitting a result data of the diagnosis function to the controller.

2. The thermal runaway detecting device as claimed in claim 1, wherein the controller determines the validity of the temperature-based detection of thermal runaway according to at least one of:
a communication state between the first measuring module and the controller,
whether the problem is generated in the first measuring module and the at least one temperature sensor, and
validity of the data received from the first measuring module.

3. The thermal runaway detecting device as claimed in claim 2, wherein:
the controller diagnoses the communication state between the first measuring module and the controller, and
when the communication state between the first measuring module and the controller is a disability state, the controller monitors the output voltage value to detect the thermal runaway of the battery system.

4. The thermal runaway detecting device as claimed in claim 2, wherein:
the controller diagnoses whether the problem is generated in the first measuring module and the at least one temperature sensor, and
when the problem is generated in the first measuring module or the at least one temperature sensor, the controller monitors the output voltage value to detect the thermal runaway of the battery system.

5. The thermal runaway detecting device as claimed in claim 4, wherein the first measuring module diagnoses whether the problem is generated in the at least one temperature sensor by monitoring at least one of the temperature values acquired from the at least one temperature sensor.

6. The thermal runaway detecting device as claimed in claim 4, wherein the first measuring module diagnoses whether a communication problem with the controller is generated by monitoring data transmitted to or received from the controller.

7. The thermal runaway detecting device as claimed in claim 2, wherein:
the controller diagnoses the validity of the data received from the first measuring module, and
when the data received from the first measuring module is determined to be invalid by the controller, the controller monitors the output voltage value to detect the thermal runaway of the battery system.

8. The thermal runaway detecting device as claimed in claim 2, wherein, when the temperature-based detection of thermal runaway is determined to be valid, the controller monitors the temperature values to detect the thermal runaway of the battery system.

9. The thermal runaway detecting device as claimed in claim 1, wherein the first measuring module and the second measuring module communicate with the controller through separate communication lines.

10. A battery system, comprising:
a plurality of battery cells; and
a thermal runaway detecting device as claimed in claim 1.

11. A thermal runaway detecting method of a battery system including a plurality of cells, the method comprising:
determining validity of temperature-based detection of thermal runaway by monitoring data received from a first measuring module for measuring temperature values of the plurality of cells through at least one temperature sensor;
detecting a thermal runaway of the battery system by selectively monitoring the temperature values measured by the first measuring module or an output voltage value of the battery system measured by a second measuring module according to a result of the determining of validity of the temperature-based detection of thermal runaway, wherein the detecting includes:

when the temperature-based detection of thermal runaway is determined to be invalid, detecting the thermal runaway of the battery system by monitoring the output voltage value, wherein the first measuring module further performs a diagnosis function for diagnosing whether a problem is generated with performance of the first measuring module and the at least one temperature sensor, the diagnosis function being performed by measuring voltage values of the plurality of cells and a battery module configured with the plurality of cells, and comparing a voltage value acquired by measuring a voltage between respective ends of the battery module with respective voltage values acquired by measuring voltages of the plurality of cells, and transmitting a result data of the diagnosis function to a controller.

12. The thermal runaway detecting method as claimed in claim 11, wherein the determining includes:
when a communication state between the first measuring module and the controller is a disability state, determining detection of the thermal runaway of the battery system based on the output voltage value.

13. The thermal runaway detecting method as claimed in claim 11, wherein the determining includes:
diagnosing the first measuring module and the at least one temperature sensor using the first measuring module; and
when the problem is generated in the first measuring module or the at least one temperature sensor, determining that the temperature-based detection of thermal runaway is invalid.

14. The thermal runaway detecting method as claimed in claim 13, wherein the diagnosing includes:
diagnosing whether the problem is generated in the first measuring module by comparing a voltage value acquired by measuring a voltage at respective ends of a battery module having the cells with voltage values acquired by measuring respective voltages of the cells.

15. The thermal runaway detecting method as claimed in claim 13, wherein the diagnosing includes:
diagnosing whether the problem is generated in the at least one temperature sensor by monitoring at least one of the temperature values acquired from the at least one temperature sensor.

16. The thermal runaway detecting method as claimed in claim 11, wherein the determining includes:
determining validity of data received from the first measuring module, and
when the data received from the first measuring module is determined to be invalid, determining that the temperature-based detection of thermal runaway is invalid.

17. The thermal runaway detecting method as claimed in claim 11, wherein the detecting includes:
when the temperature-based detection of thermal runaway is determined to be valid, detecting the thermal runaway of the battery system by monitoring the temperature values.

* * * * *